(12) United States Patent
Kajiyama

(10) Patent No.: US 6,760,250 B2
(45) Date of Patent: Jul. 6, 2004

(54) MAGNETIC RANDOM ACCESS MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/306,404

(22) Filed: Nov. 29, 2002

(65) Prior Publication Data
US 2003/0103378 A1 Jun. 5, 2003

(30) Foreign Application Priority Data
Nov. 30, 2001 (JP) ........................................ 2001-367753

(51) Int. Cl.$^7$ ............................................. G11C 11/00
(52) U.S. Cl. ......................... 365/158; 365/171; 365/66
(58) Field of Search ................. 365/158, 171, 365/173, 157, 66, 74, 97, 232

(56) References Cited

U.S. PATENT DOCUMENTS

| | | | | | |
|---|---|---|---|---|---|
| 5,894,447 | A | * | 4/1999 | Takashima | 365/158 |
| 6,670,660 | B2 | * | 12/2003 | Hosotani | 257/295 |
| 2003/0235070 | A1 | * | 12/2003 | Ooishi | 365/158 |

FOREIGN PATENT DOCUMENTS

JP 2000-163950 6/2000

OTHER PUBLICATIONS

R. Scheuerlein, et al., ISSCC 2000/Session 7/TD: Emerging Memory & Device Technologies, Paper TA 7.2, pp. 128–129–, 94–95, and 409–410. "A 10ns Read and Write Non–Volatiele Memory Array Using a Magnetic Tunnel Junction and FET Switch in Each Cell", 2000.

* cited by examiner

Primary Examiner—Gene Auduong
(74) Attorney, Agent, or Firm—Oblon, Spivak, McClelland, Maier & Neustadt, P.C.

(57) ABSTRACT

MTJ elements are accumulated in a plurality of portions on a semiconductor substrate. Upper lines and lower lines extending in the X direction are connected to the MTJ elements. The number of MTJ elements arranged in each portion is gradually increased from a lower portion towards an upper portion. With respect to the upper lines, the upper lines arranged in the lower portion are connected to transistors present near an array of the MTJ elements, and the upper lines arranged in the upper portion are connected to transistors distant from the array of the MTJ elements. Also with respect to the lower lines, the lower lines in the lower portion are connected to transistors nearer to the array of the TRM elements than the lower lines in the upper portion.

25 Claims, 12 Drawing Sheets

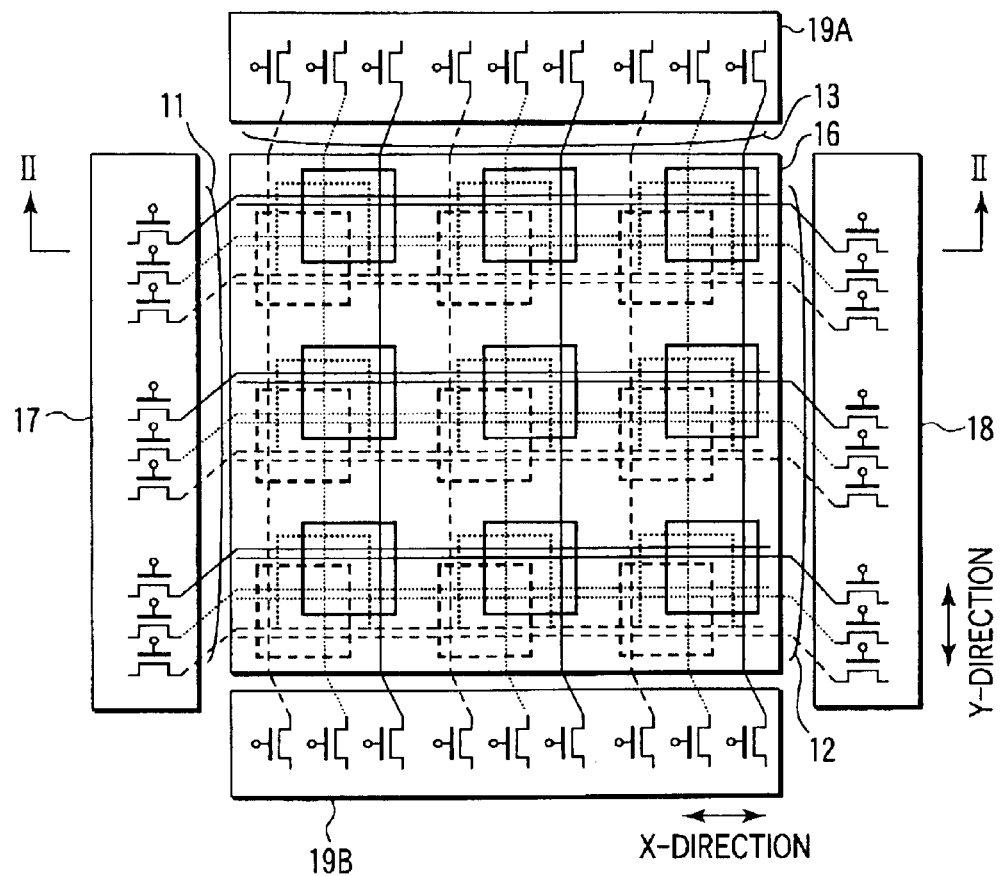
FULL LINE (——): UPPER PORTION
DOTTED LINE (······): MIDDLE PORTION
BROKEN LINE (---): LOWER PORTION
F I G. 1
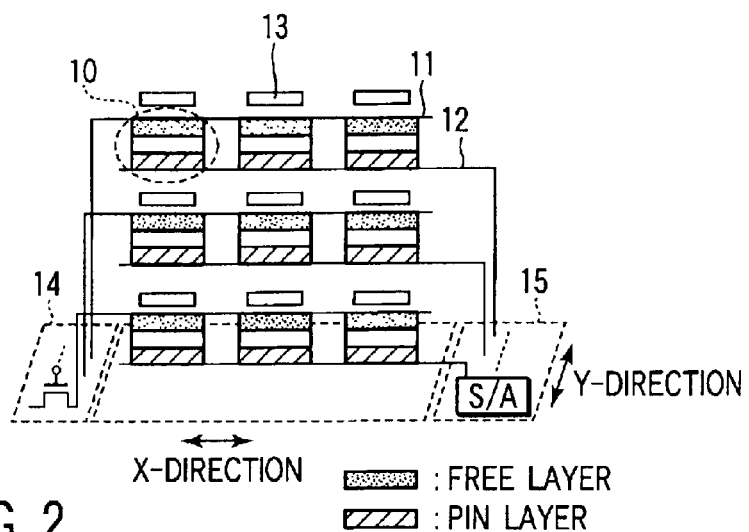
▓ : FREE LAYER
▨ : PIN LAYER
F I G. 2

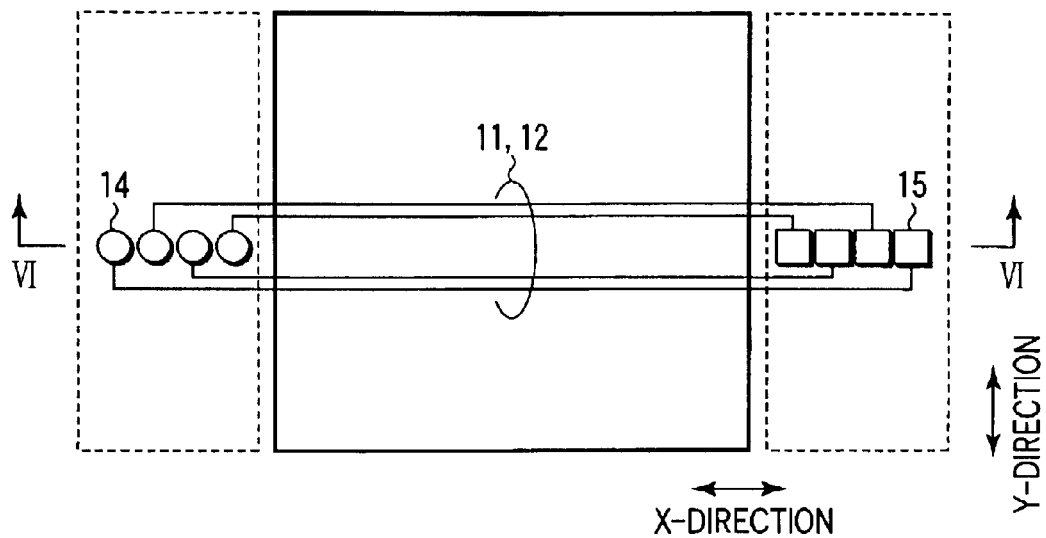
F I G. 5
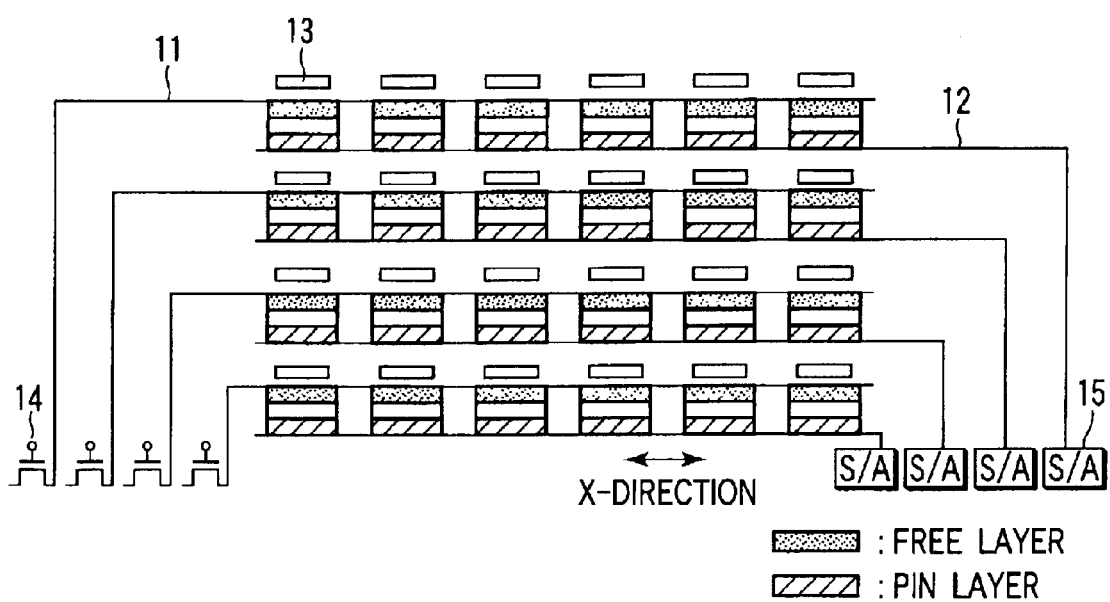
F I G. 6

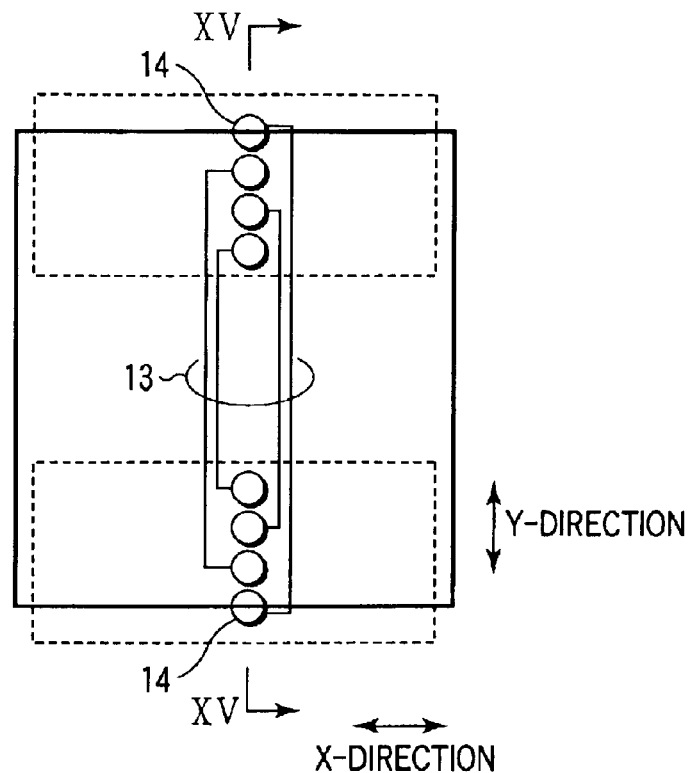
F I G. 14
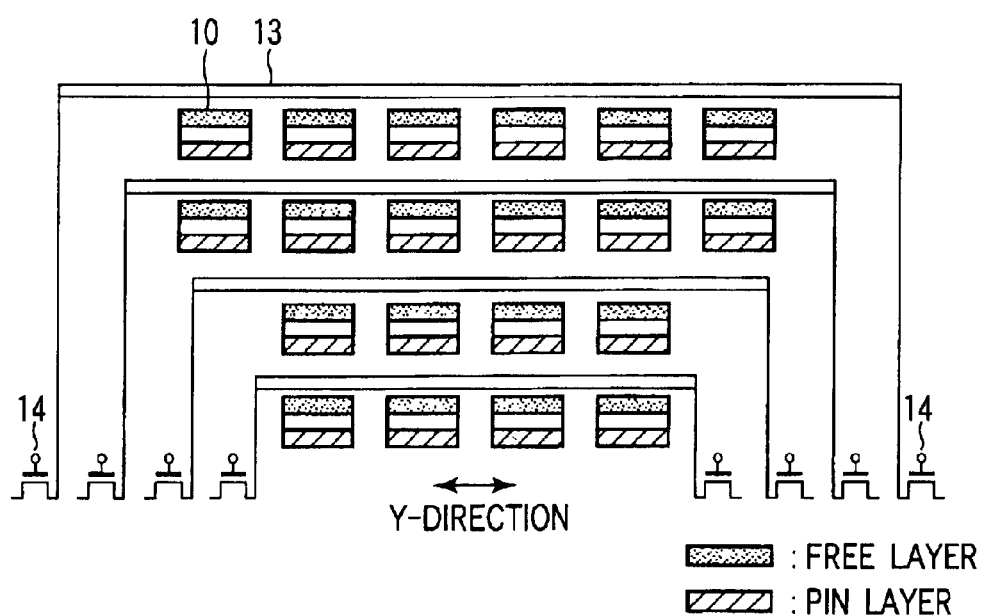
F I G. 15

▓▓▓ : FREE LAYER
▨▨▨ : PIN LAYER

MAGNETIC RANDOM ACCESS MEMORY

CROSS-REFERENCE TO RELATED APPLICATIONS

This application is based upon and claims the benefit of priority from the prior Japanese Patent Application No. 2001-367753, filed Nov. 30, 2001, the entire contents of which are incorporated herein by reference.

BACKGROUND OF THE INVENTION

1. Field of the Invention

The present invention relates to a magnetic random access memory (MRAM) in which a memory cell is constructed using MTJ (Magnetic Tunnel Junction) elements having "1", "0"-information stored therein by a tunneling magneto resistive effect.

2. Description of the Related Art

In recent years, there have been proposed many memories having information stored therein by new methods, and one of them is the tunneling magneto resistive (hereinafter, denoted as TMR) effect proposed by Roy Scheuerlein et. al. (for example, refer to ISSCC2000 Technical Digest p. 128 "A 10 ns Read and Write Non-Volatile Memory Array Using a Magnetic Tunnel Junction and FET Switch in each cell").

The magnetic random access memory stores "1", "0"-information by the MTJ elements. The MTJ elements have a structure in which an insulation layer (tunnel barrier) is sandwiched with two ferromagnetic layers. The information stored in the MTJ elements is determined by whether or not the orientations of spins of the two ferromagnetic layers are parallel or anti-parallel.

Here, parallel means that the orientations of the spins of the two ferromagnetic layers are the same, and anti-parallel means that the orientations of the spins of the two ferromagnetic layers are opposite to each other.

Generally, one of the two ferromagnetic layers constructing the MTJ element is a pin layer in which the orientation of the spin is pinned. When "1", "0"-information is stored in the MTJ elements, the orientation of the other one (free layer) of the two ferromagnetic layers is varied according to written information.

BRIEF SUMMARY OF THE INVENTION

A magnetic random access memory according to a first aspect of the invention comprises: an array having a plurality of MTJ elements accumulated in a plurality of portions; first conductive lines arranged in the array; first elements connected to the first conductive lines; second conductive lines arranged in the array which have the same function as that of the fist conductive lines and are arranged above the first conductive lines; and second elements connected to the second conductive lines, wherein the number of MTJ elements arranged in at least one portion of the plurality of portions is larger than the number of MTJ elements arranged in each portion lower than the portion, and the first and second elements are arranged immediately below or on the periphery of the array.

A magnetic random access memory according to a second aspect of the invention comprises: an array having a plurality of MTJ elements accumulated in a plurality of portions; first conductive lines arranged in the array; fist elements connected to the conductive lines; second conductive lines arranged in the array which have the same function as that of the first conductive lines, and are formed above the first conductive lines; second elements connected to the second conductive lines, wherein the first and second elements are both arranged on the periphery of the array but immediately below the array, and the first elements are arranged nearer to the array than the second elements.

BRIEF DESCRIPTION OF THE SEVERAL VIEWS OF THE DRAWING

FIG. 1 is a plan view showing an array section of a memory as a reference example;

FIG. 2 is a section view taken along the line II—II of FIG. 1;

FIG. 5 is a plan view showing an array section of a memory according to a second embodiment of the present invention;

FIG. 6 is a section view taken along the line VI—VI of FIG. 5;

FIG. 14 is a plan view showing a cell array section of a memory according to a seventh embodiment of the present invention;

FIG. 15 is a section view taken along the line XV—XV of FIG. 14;

DETAILED DESCRIPTION OF THE INVENTION

Figure 3:
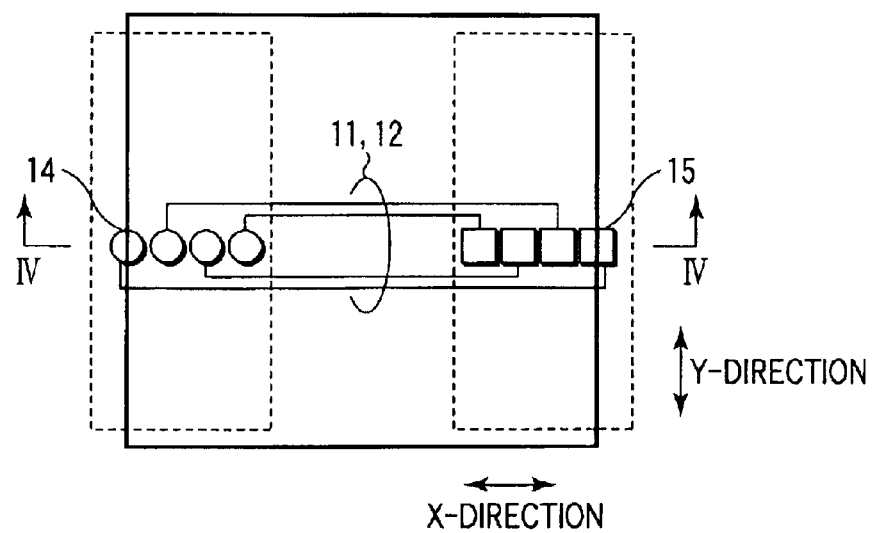
FIG. 3 is a plan view showing an array section of a memory according to a first embodiment of the present invention.

Hereinafter, a magnetic random access memory according to embodiments of the present invention will be described in detail with reference to the drawings.

1. Presupposed Technique

In recent years, various MRAMs of a device structure or circuit structure have been proposed, and one of them has a device structure in which a plurality of MTJ elements are connected to one switching element (selective transistor). This structure is advantageous for high density of cells or improvement of read margins.

For example, in a ladder type cell structure, a plurality of MTJ elements are connected in parallel between upper lines and lower lines. In this cell structure, as shown in FIGS. 1 and 2, a plurality of MTJ elements 10 are accumulated in a plurality of portions (in this example, three portions) on a substrate. Further, in each portion, a plurality of MTJ elements 10 are connected in parallel between upper lines 11 and lower lines 12.

The upper lines 11 extend in the X direction, and one ends thereof are connected to selective transistors 14. The lower lines 12 also extend in the X direction, and one ends thereof are connected to peripheral circuits such as sense amplifiers (S/A) 15. In this example, a read current flows in the path from the upper lines 11 through the MTJ elements 10 to the lower lines 12, that is along the X direction. Write lines 13 are arranged adjacent to the MTJ elements 10, and extend in the Y direction.

In FIG. 1, the accumulated MTJ elements and conductive lines extending in the X direction are shown in a shifted manner from each other in each portion, which facilitates the description. Actually, they may be shifted from each other or may be fully overlapped.

A basic structure of a cell of the magnetic random access memory is a 1 cell-1 transistor structure in which one switching element (selective transistor) is corresponded to one MTJ element. However, in the device structure in which the MTJ elements are accumulated in a plurality of portions, when one switching element is corresponded to one MTJ element, the number of switching elements becomes larger, which is disadvantageous for high density of cells.

In the case of the device structure in which the MTJ elements 10 are accumulated in a plurality of portions, there is employed the device structure in which, even when one switching element is not corresponded to one MTJ element, a read operation or write operation can be performed.

For example, in the device structure shown in FIGS. 1 and 2, a plurality of MTJ elements 10 are connected between the upper lines 11 and the lower lines 12 in each portion of an array of the MTJ elements 10. Further, for example, the selective transistors 14 are connected to one end of the upper lines 11, and the sense amplifiers (S/A) 15 are connected to one end of the lower lines 12.

However, in this case, the selective transistors are required for the respective upper lines 11 arranged in each portion of the array of the MTJ elements 10. Further, the upper lines 11 extend in the X direction on the array 16 of the MTJ elements 10. Therefore, the selective transistors to be connected to the upper lines 11 are intensively arranged in an area 17 at the end of the array 16.

Similarly, the sense amplifiers (transistors) are required for the respective lower lines (read lines) 12 arranged in each portion of the array of the MTJ elements 10. Further, the lower lines 12 extend in the X direction on the array 16 of the MTJ elements 10. Therefore, the transistors to be connected to the lower lines 12 are intensively arranged in an area 18 at the end of the array 16.

Similarly, the selective transistors are required for the respective write lines 13 arranged in each portion of the array of the MTJ elements 10. Further, the write lines 13 extend in the Y direction on the array 16 of the MTJ elements 10. Therefore, the selective transistors to be connected to the write lines 13 are intensively arranged in areas 19A and 19B at the end of the array 16.

In data write/read operation with respect to the MTJ elements, it is known that a large current is required due to the characteristics of the MTJ elements. Therefore, it is expected that the size (or pitch) of the transistors to be connected to the upper lines 11, the lower lines 12, and the write lines 13 inevitably becomes larger.

Further, in the case where a group of MTJ elements arranged in the X direction is assumed to be one column, and a group of MTJ elements arranged in the Y direction is assumed to be one row, when the number of accumulated portions of the MTJ elements is increased, the number of transistors which must be provided in one row or column is also increased in proportion thereto.

The pitch of the MTJ elements is not influenced by the number of accumulated portions of the MTJ elements. Therefore, when the number of accumulated portions of the MTJ elements is greatly increased, only the number of transistors in one row or column is increased, meaning that all the transistors cannot be arranged in the areas 17, 18, 19A, and 19B on the periphery of the array 16.

On the contrary, when it is assumed that all the transistors are arranged in the areas 17, 18, 19A and 19B on the periphery of the array 16, the pitch of the transistors is large, thus increasing the pitch of the MTJ elements 10. Ultimately, high integration of the MTJ elements cannot be achieved.

When the size of the transistors is reduced and the pitch thereof is made smaller, a large current is not available, which interferes with the operation of the memory.

2. Outline

Embodiments according to the present invention are applied to a magnetic random access memory having an array structure in which MTJ elements are accumulated in a plurality of portions.

A first characteristic of the magnetic random access memory according to the present invention lies in that the number of MTJ elements arranged in at least one portion of a plurality of portions is set to be larger than the number of MTJ elements arranged in each portion lower the portion.

For example, the number of MTJ elements arranged in each portion is set to be gradually increased from a lower portion towards an upper portion.

Since the transistors can be arranged immediately below the array of the MTJ elements according to such an array structure, even when the number of accumulated portions of the MTJ elements is increased so that the number of transistors connected to conductive lines in one row or column is increased, the pitch of the MTJ elements can be determined irrespective of the pitch of the transistors.

A second characteristic of the magnetic random access memory according to the present invention lies in that, with respect to the conductive lines having the same function and arranged in the array of the MTJ elements, the conductive lines positioned in the lower portion are connected to the transistors present near the array of the MTJ elements, and the conductive lines positioned in the upper portion are connected to the transistors far away from the array of the MTJ elements. With such a device structure, even when the number of transistors connected to the conductive lines in one row or column is increased, the transistors are arranged in a line from the vicinity of the array to a certain point. Therefore, the pitch of the MTJ elements can be determined irrespective of the pitch of the transistors.

3. Embodiments (1) First Embodiment

Figure 4:
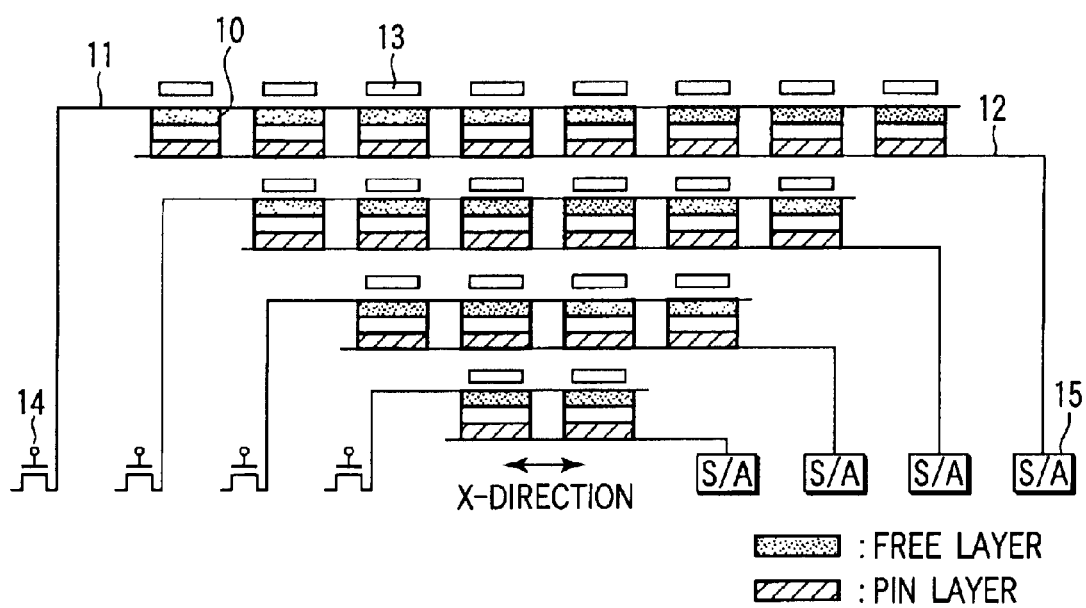
FIG. 4 is a section view taken along the line IV—IV of FIG. 3.

FIG. 3 shows an outline of a layout of a cell array section of a magnetic random access memory according to a first embodiment of the present invention. FIG. 4 shows a section taken along the X direction (one column) of the cell array section of FIG. 3, that is a section taken along the line IV—IV of FIG. 3.

A plurality of MTJ elements 10 are accumulated in a plurality of portions (in this embodiment, four portions) on a semiconductor substrate. Further, the MTJ elements 10 construct the array in the X-Y plane in each portion.

The upper lines 11 and the lower lines 12 both extend in the X direction, and a plurality of MTJ elements 10 arranged in the X direction are arranged between both the conductive lines 11 and 12. The selective transistors 14 are connected to one end of the upper lines 11. Further, the peripheral circuits such as the sense amplifiers (S/A) 15 are connected to one end of the lower lines 12.

The upper lines 11 and the lower lines 12 function as a read line. In other words, a read current flows in the path from the upper lines 11 through the MTJ elements 10 to the lower lines 12, that is, along the X direction during data reading.

The write lines 13 are arranged on the MTJ elements 10 in each portion of the array of the MTJ elements 10, and extend in the Y direction. Further, the write lines 13 are arranged in the vicinity of free layers of the MTJ elements 10.

The number of MTJ elements 10 is gradually increased from the lower portion towards the upper portion. In the present embodiment, with respect to the MTJ elements 10 in one column, the number of MTJ elements 10 is set to be gradually increased from the lower portion towards the upper portion.

Since the transistors can be arranged immediately below the array of the MTJ elements 10 according to such an array structure, even when the number of accumulated portions of the MTJ elements 10 is increased so that the number of transistors connected to the conductive lines in one column is increased, it is possible to secure sufficient areas for forming the transistors.

Further, with respect to the conductive lines having the same function and arranged in the array of the MTJ elements 10, for example, the upper lines 11 extending in the X direction, the upper lines 11 positioned in the lower portion are connected to the transistors present near the array of the MTJ elements 10, and the upper lines 11 positioned in the upper portion are connected to the transistors far away from the array of the MTJ elements 10.

Similarly, also with respect to the lower lines 12 extending in the X direction, the lower lines 12 positioned in the lower portion are connected to the sense amplifiers (transistors) 15 present near the array of the MTJ elements 10, and the lower lines 12 positioned in the upper portion are connected to the sense amplifiers (transistors) 15 far away from the array of the MTJ elements 10.

With such a device structure, even when the number of accumulated portions of the MTJ elements 10 is increased so that the number of transistors connected to the conductive lines in one column is increased, the transistors are arranged in a line from the vicinity of the array to a distant point. Therefore, the pitch of the MTJ elements can be determined irrespective of the pitch of the transistors.

As described above, in the present embodiment, the number of MTJ elements 10 is gradually increased from the lower portion towards the upper portion of the array of the MTJ elements 10. Further, with respect to the conductive lines having the same function and arranged in the array of the MTJ elements 10, the conductive lines in the upper portion are connected to the transistors further away from the array of the MTJ elements 10 as compared with the conductive lines in the lower portion.

Therefore, even when the number of transistors connected to the conductive lines arranged in the array of the MTJ elements is increased, the pitch of the MTJ elements can be determined irrespective of the number of transistors, thereby achieving fining or high integration of the MTJ elements.

(2) Second Embodiment

In the first embodiment described above, with respect to the array of the MTJ elements accumulated in a plurality of portions, the number of MTJ elements is gradually increased from the lower portion towards the upper portion. However, in consideration of the resistance of the MTJ elements, the wiring resistance, the wiring capacitance, and the like, there is a case where the number of the MTJ elements is different for each portion, which affects the read/write operation and the like.

In the present embodiment, in consideration of the above point, assuming that the number of MTJ elements in each portion is not varied and is made constant with respect to the array of the MTJ elements accumulated in a plurality of portions, there is proposed a technique for preventing increase in the pitch of the MTJ elements, and achieving fining or high integration of the MTJ elements under the precondition.

FIG. 5 shows an outline of a layout of a cell array section of a magnetic random access memory according to a second embodiment of the present invention. FIG. 6 shows a section taken along the X direction (one column) of the cell array section of FIG. 5, that is a section taken along the line VI—VI of FIG. 5.

A plurality of MTJ elements 10 are accumulated in a plurality of portions (in this embodiment, four portions) on the semiconductor substrate. Further, in each portion, the MTJ elements 10 construct the array in the X-Y plane.

The upper lines 11 and the lower lines 12 both extend in the X direction, and a plurality of MTJ elements 10 arranged in the X direction are arranged between both the conductive lines 11 and 12. The selector transistors 14 are connected to one end of the upper lines 11. Further, the peripheral circuits such as the sense amplifiers (S/A) 15 are connected to one end of the lower lines 12.

The upper lines 11 and the lower lines 12 function as a read line. In other words, a read current flows in the path from the upper lines 11 through the MTJ elements 10 to the lower lines 12, that is, along the X direction during data reading.

The write lines 13 are arranged on the MTJ elements 10 in each portion of the array of the MTJ elements 10, and extend in the Y direction. Further, the write lines 13 are arranged in the vicinity of the free layers of the MTJ elements 10.

With respect to the conductive lines having the same function and arranged in the array of the MTJ elements 10, for example, the upper lines 11 extending in the X direction, the upper lines 11 positioned in the lower portion are connected to the transistors present near the array of the MTJ elements 10, and the upper lines 11 positioned in the upper portion are connected to the transistors far away from the array of the MTJ elements 10.

Further, also with respect to the lower lines 12 extending in the X direction, the lower lines 12 positioned in the lower portion are connected to the sense amplifiers (transistors) 15 present near the array of the MTJ elements 10, and the lower lines 12 positioned in the upper portion are connected to the sense amplifiers (transistors) 15 distant from the array of the MTJ elements 10.

With such a device structure, even when the number of accumulated portions of the MTJ elements 10 is increased so that the number of transistors connected to the conductive lines in one column is increased, the transistors are arranged in a line from the vicinity of the array to a distance. Therefore, the pitch of the MTJ elements can be determined irrespective of the pitch of the transistors.

As described above, in the present embodiment, with respect to the conductive lines having the same function and arranged in the array of the MTJ elements 10, the conductive lines in the upper portion are connected to the transistors farther away from the array of the MTJ elements 10 as compared with the conductive lines in the lower portion.

Therefore, even when the number of transistors connected to the conductive lines arranged in the array of the MTJ elements 10 is increased, the pitch of the MTJ elements can be determined irrespective of the number of transistors, thereby achieving fining or high integration of the MTJ elements.

(3) Third Embodiment

Figure 7:
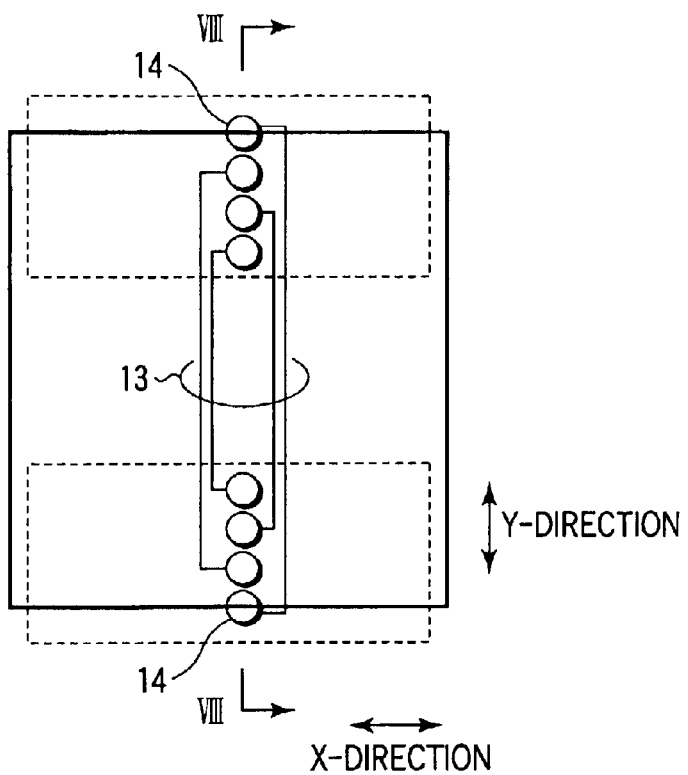
FIG. 7 is a plan view showing an array section of a memory according to a third embodiment of the present invention.
Figure 8:
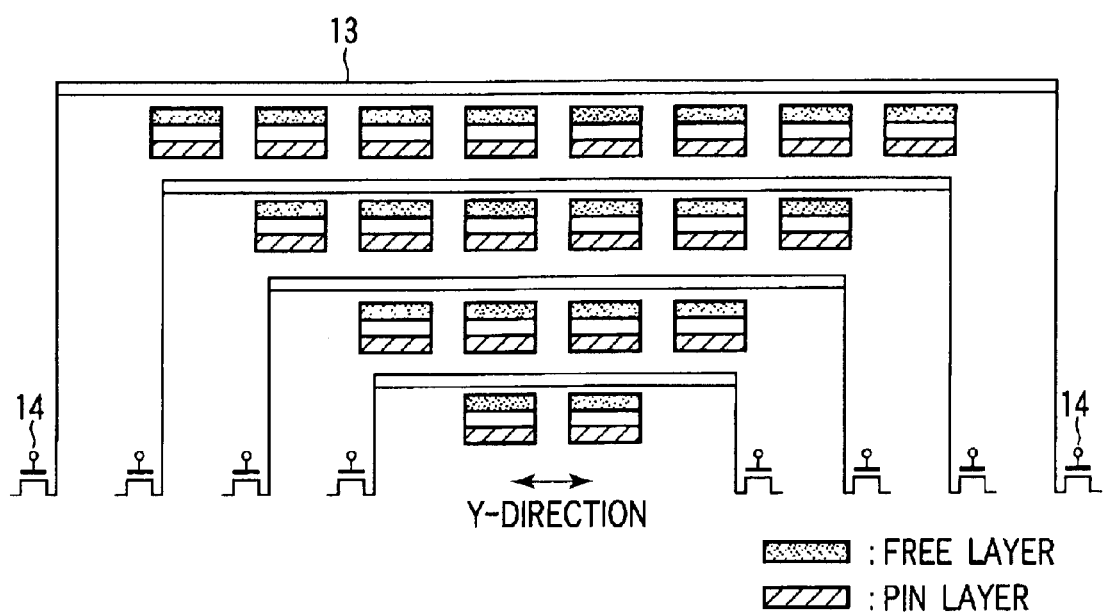
FIG. 8 is a section view taken along the line VIII—VIII of FIG. 7.

FIG. 7 shows an outline of a layout of a cell array section of a magnetic random access memory according to a third embodiment of the present invention. FIG. 8 shows a section taken along the Y direction (one row) of the cell array section of FIG. 7, that is a section taken along the line VIII—VIII of FIG. 7.

A plurality of MTJ elements 10 are accumulated in a plurality of portions (in the present embodiment, four portions) on the semiconductor substrate. Further, the MTJ elements 10 construct the array in the X-Y plane in each portion.

The upper lines are connected to the free layers of the MTJ elements 10, the lower lines are connected to pin layers of the MTJ elements, and both the conductive lines extend in the X direction. In the present embodiment, the upper lines and the lower lines are omitted in order to simplify the description.

The write lines 13 are arranged on the MTJ elements 10 in each portion of the array of the MTJ elements 10, and extend in the Y direction. Further, the write lines 13 are arranged in the vicinity of the free layers of the MTJ elements 10.

The number of MTJ elements 10 is gradually increased from the lower portion towards the upper portion. In the present embodiment, with respect to the MTJ elements 10 in one row, the number of MTJ elements 10 is set to be gradually increased from the lower portion towards the upper portion.

Since the transistors can be arranged immediately below the array of the MTJ elements 10 according to such an array structure, even when the number of accumulated portions of the MTJ elements 10 is increased so that the number of transistors connected to the conductive lines in one column is increased, it is possible to secure sufficient areas for forming the transistors.

Further, with respect to the conductive lines having the same function and arranged in the array of the MTJ elements 10, for example, the write lines 13 extending in the Y direction, the write lines 13 positioned in the lower portion are connected to the transistors present near the array of the MTJ elements 10, and the write lines 13 positioned in the upper portion are connected to the transistors distant from the array of the MTJ elements 10.

With such a device structure, even when the number of accumulated portions of the MTJ elements 10 is increased so that the number of transistors connected to the conductive lines in one row is increased, the transistors are arranged in a line from the vicinity of the array to a distant point. Therefore, the pitch of the MTJ elements can be determined irrespective of the pitch of the transistors.

As described above, in the present embodiment, the number of MTJ elements 10 is gradually increased from the lower portion towards the upper portion of the array of the MTJ elements 10. Further, with respect to the conductive lines having the same function and arranged in the array of the MTJ elements 10, the conductive lines in the upper portion are connected to the transistors further away from the array of the MTJ elements 10 as compared with the conductive lines in the lower portion.

Therefore, even when the number of transistors connected to the conductive lines arranged in the array of the MTJ elements is increased, the pitch of the MTJ elements can be determined irrespective of the number of transistors, thereby achieving fining or high integration of the MTJ elements.

(4) Fourth Embodiment

Figure 9:
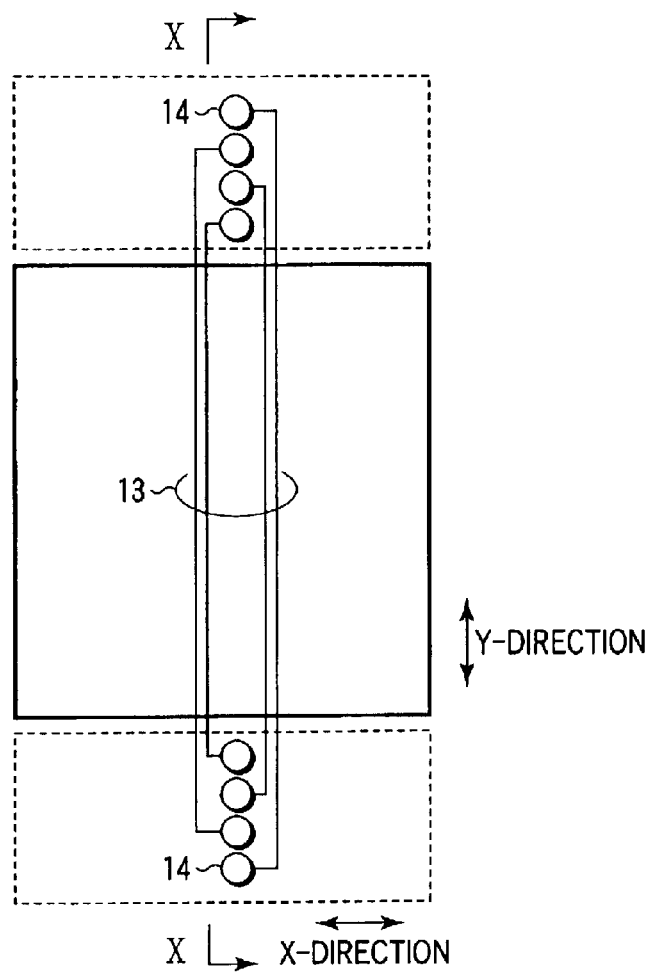
FIG. 9 is a plan view showing an array section of a memory according to a fourth embodiment of the present invention.
Figure 10:
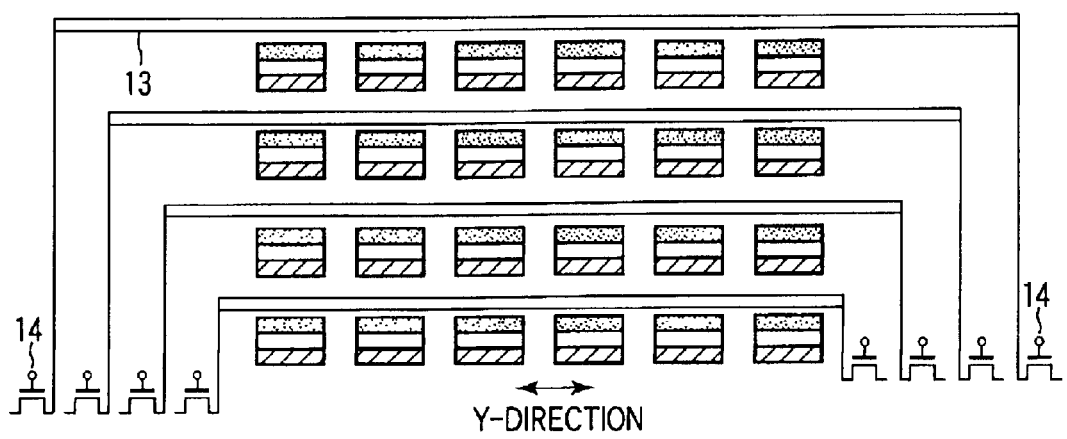
FIG. 10 is a section view taken along the line X—X of FIG. 9.

FIG. 9 shows an outline of a layout of a cell array section of a magnetic random access memory according to a fourth embodiment of the present invention. FIG. 10 shows a section taken along the Y direction (one row) of the cell array section of FIG. 9, that is a section taken along the line X—X of FIG. 9.

In the fourth embodiment, by the similar reason with the second embodiment, assuming that the number of transistors in each portion is not varied and is made constant with respect to the MTJ elements accumulated in a plurality of portions, there is proposed a technique for preventing increase in the pitch of the MTJ elements and achieving fining or high integration of the MTJ elements under the precondition.

A plurality of MTJ elements 10 are accumulated in a plurality of portions (in the present embodiment, four portions) on the semiconductor substrate. Further, the MTJ elements 10 construct the array in the X-Y plane in each portion.

The upper lines are connected to the free layers of the MTJ elements 10, the lower lines are connected to the pin layers of the MTJ elements, and both the conductive lines extend in the X direction. In the present embodiment, the upper lines and the lower lines are omitted in order to simplify the description.

The write lines 13 are arranged on the MTJ elements 10 in each portion of the array of the MTJ elements 10, and extend in the Y direction. Further, the write lines 13 are arranged in the vicinity of the free layers of the MTJ elements 10.

With respect to the conductive lines having the same function and arranged in the array of the MTJ elements 10, for example, the write lines 13 extending in the Y direction, the write lines 13 positioned in the lower portion are connected to the transistors present near the array of the MTJ elements 10, and the write lines 13 positioned in the upper portion are connected to the transistors distant from the array of the MTJ elements 10.

With such a device structure, even when the number of accumulated portions of the MTJ elements 10 is increased so that the number of transistors connected to the conductive lines in one column is increased, the transistors are arranged in a line from the vicinity of the array to a distant point. Therefore, the pitch of the MTJ elements can be determined irrespective of the pitch of the transistors.

As described above, in the present embodiment, with respect to the conductive lines having the same function and arranged in the array of the MTJ elements 10, the conductive lines in the upper portion are connected to the transistors further away from the array of the MTJ elements 10 as compared with the conductive lines in the lower portion.

Therefore, even when the number of transistors connected to the conductive lines arranged in the array of the MTJ elements is increased, the pitch of the MTJ elements can be determined irrespective of the number of transistors, thereby achieving fining or high integration of the MTJ elements.

(5) Fifth Embodiment

Figure 11:
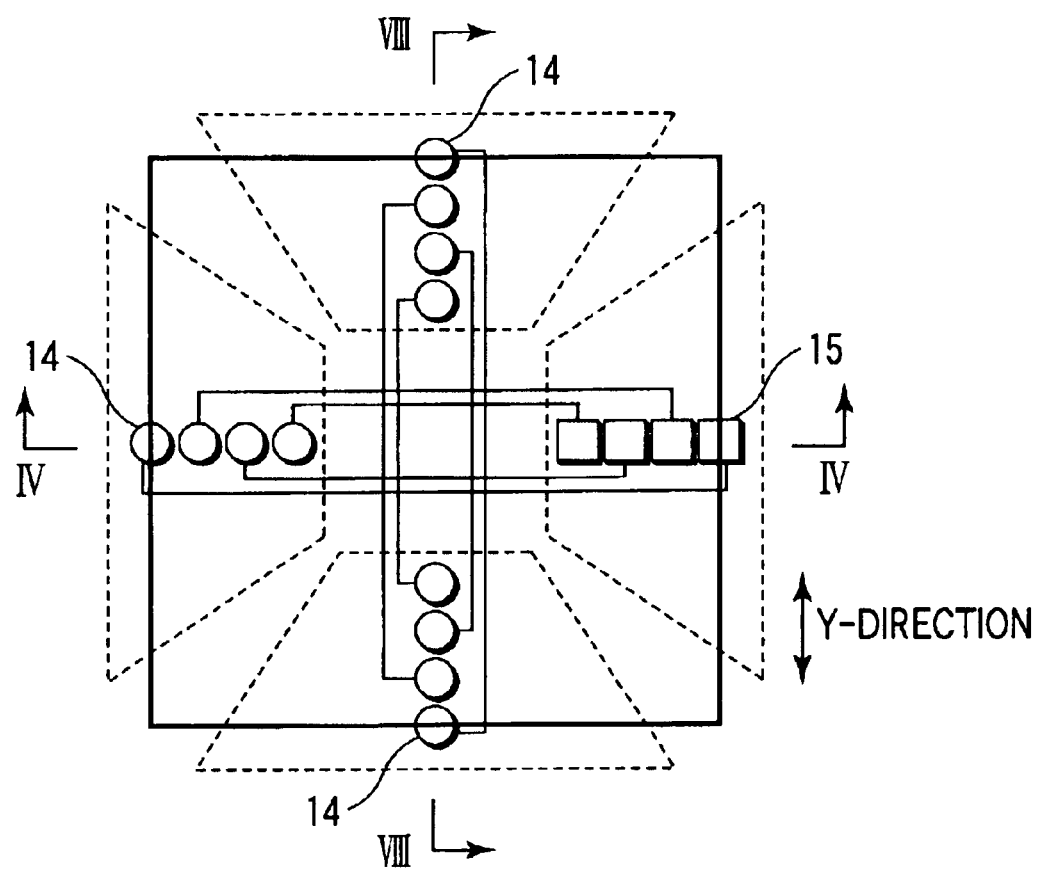
FIG. 11 is a plan view showing a cell array section of a memory according to a fifth embodiment of the present invention.

FIG. 11 shows an outline of a layout of a cell array section of a magnetic random access memory according to a fifth embodiment of the present invention. A section taken along the line IV—IV of FIG. 11 is same as that of FIG. 4, and a section taken along the line VIII—VIII of FIG. 11 is same as that of FIG. 8.

The magnetic random access memory according to the present embodiment relates to a combination of the first embodiment and the third embodiment.

A plurality of MTJ elements are accumulated in a plurality of portions on the semiconductor substrate. The MTJ elements construct the array in the X-Y plane in each portion.

The upper lines 11 are connected to the free layers of the MTJ elements, the lower lines 12 are connected to the pin layers of the MTJ elements, and both the conductive lines 11 and 12 extend in the X direction. The write lines 13 are arranged on the MTJ elements and extend in the Y direction in each portion of the array of the MTJ elements. Further, the write lines 13 are arranged in the vicinity of the free layers of the MTJ elements.

The number of MTJ elements is gradually increased from the lower portion towards the upper portion as shown in FIGS. 4 and 8, for example. In the present embodiment, the number of MTJ elements is set to be gradually increased from the lower portion towards the upper portion with respect to the MTJ elements in one row, and the number of MTJ elements is set to be gradually increased from the lower portion towards the upper portion with respect to the MTJ elements in one column.

Since the transistors can be arranged immediately below the array of the MTJ elements according to such an array structure, even when the number of accumulated portions of the MTJ elements is increased so that the number of transistors connected to the conductive lines in one column is increased, it is possible to secure sufficient areas for forming the transistors.

Further, with respect to the conductive lines having the same function and arranged in the array of the MTJ elements, for example, the write lines 13 extending in the Y direction, the write lines 13 positioned in the lower portion are connected to the transistors present near the array of the MTJ elements 10, and the write lines 13 positioned in the upper portion are connected to the transistors distant from the array of the MTJ elements 10.

With such a device structure, even when the number of accumulated portions of the MTJ elements 10 is increased so that the number of transistors connected to the conductive lines in one row is increased, the transistors are arranged in a line from the vicinity of the array to a distance. Therefore, the pitch of the MTJ elements can be determined irrespective of the pitch of the transistors.

(6) Sixth Embodiment

Figure 12:
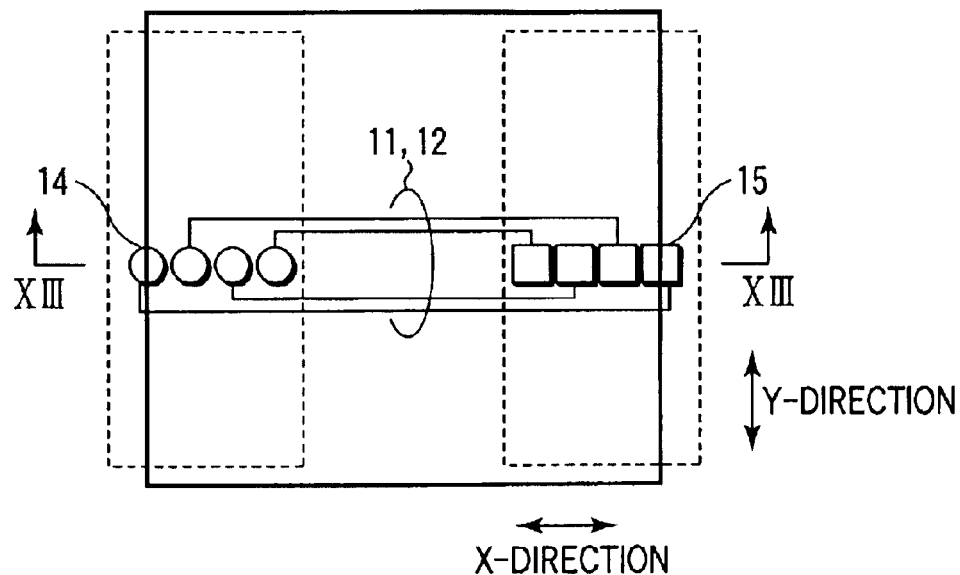
FIG. 12 is a plan view showing a cell array section of a memory according to a sixth embodiment of the present invention.
Figure 13:
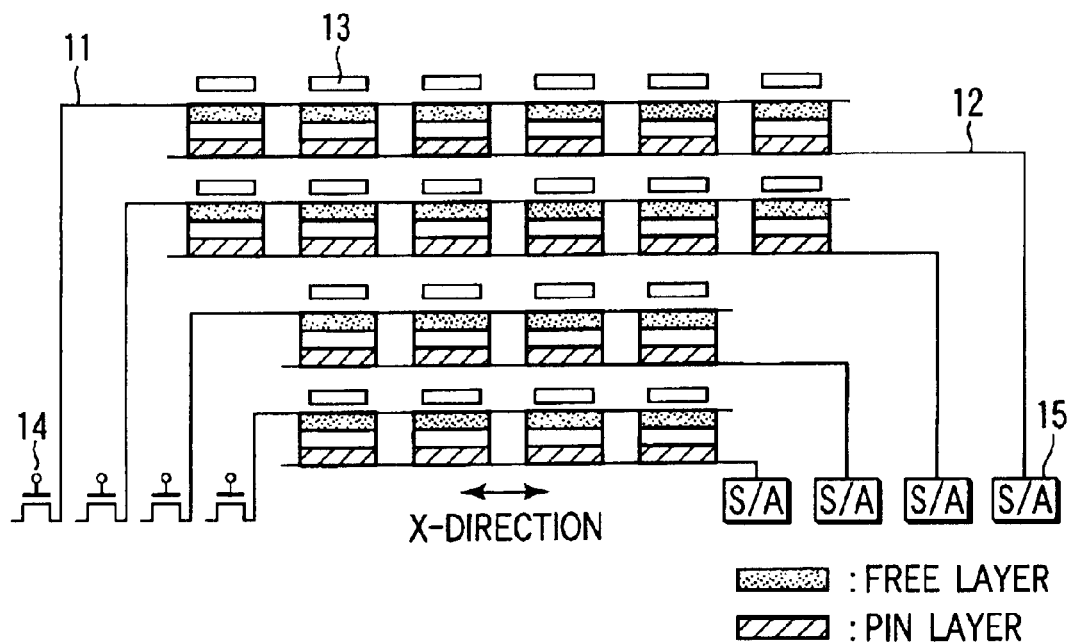
FIG. 13 is a section view taken along the line XIII—XIII of FIG. 12.

FIG. 12 shows an outline of a layout of a cell array section of a magnetic random access memory according to a sixth embodiment of the present invention. FIG. 13 is a section view taken along the line XIII—XIII of FIG. 12.

The magnetic random access memory according to the present embodiment is a modified example of the first embodiment.

One characteristic of the present invention lies in that the number of MTJ elements arranged in at least one portion of a plurality of portions is set to be larger than the number of MTJ elements arranged in each portion lower the portion. In the first embodiment (FIGS. 3 and 4), the number of MTJ elements 10 is set to be gradually increased from the lower portion of the array of the MTJ elements 10 towards the upper portion.

On the contrary, in the sixth embodiment, the number of MTJ elements 10 is set to be gradually increased from the lower portion of the array of the MTJ elements 10 towards the upper portion every two portions. In other words, in the present embodiment, the cell array includes a plurality of portions which are equal in the number of MTJ elements 10.

In the sixth embodiment, the number of MTJ elements 10 is set to be gradually increased from the lower portion of the array of the MTJ elements 10 towards the upper portion every two portions, but may of course be set to be gradually increased every n (n is a natural number not less than 3) portions.

Also in the sixth embodiment, the same effect as the first embodiment can be obtained.

(7) Seventh Embodiment

FIG. 14 shows an outline of a layout of a cell array section of a magnetic random access memory according to a seventh embodiment of the present invention. FIG. 15 is a section view taken along the line XV—XV of FIG. 14.

The magnetic random access memory according to the present embodiment is a modified example of the third embodiment.

One characteristic of the present invention lies in that the number of MTJ elements in at least one portion of a plurality of portions is set to be larger than the number of MTJ elements arranged in each portion lower than the portion. In the third embodiment (FIGS. 7 and 8), the number of MTJ elements 10 is set to be gradually increased from the lower portion of the array of the MTJ elements 10 towards the upper portion.

On the contrary, in the seventh embodiment, the number of MTJ elements 10 is set to be gradually increased from the lower portion of the array of the MTJ elements 10 towards the upper portion every two portions. In other words, in the present embodiment, the cell array includes a plurality of portions which are equal in the number of MTJ elements 10.

In the seventh embodiment, the umber of MTJ elements 10 is set to be gradually increased from the lower portion of the array of the MTJ elements 10 towards the upper portion every two portions, but may of course be set to be gradually increased every n (n is a natural number not less than 3) portions.

Also in the seventh embodiment, the same effect as the third embodiment can be obtained.

(8) Eighth Embodiment

Figure 16:
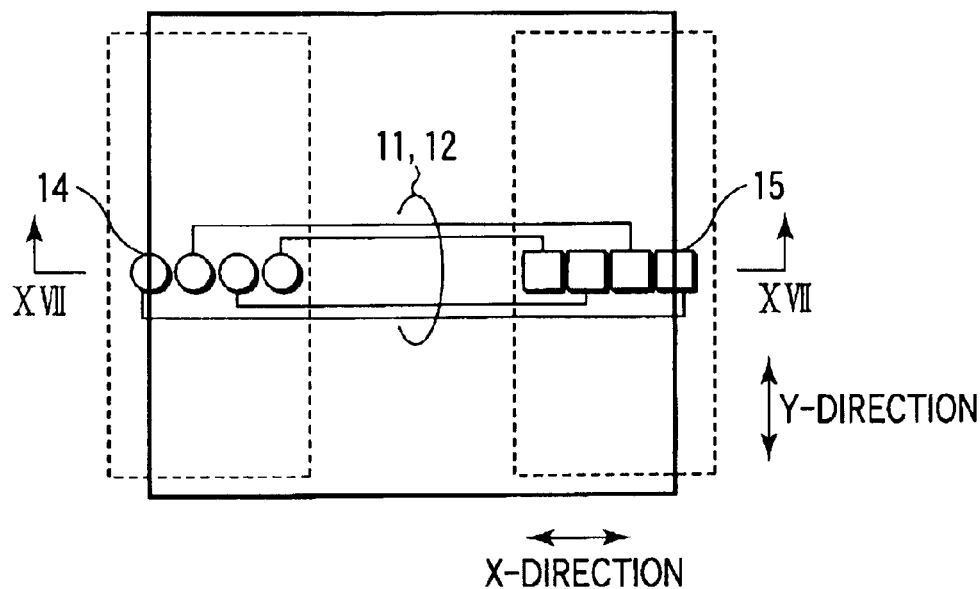
FIG. 16 is a plan view showing a cell array section of a memory according to a eighth embodiment of the present invention.
Figure 17:
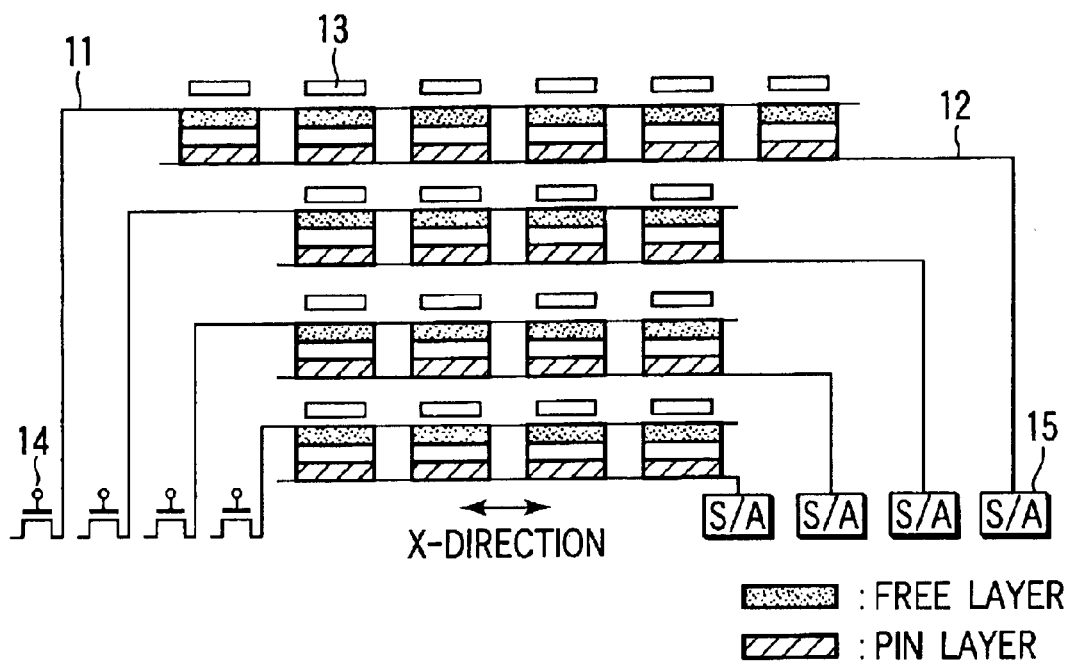
FIG. 17 is a section view taken along the line XVII—XVII of FIG. 16.

FIG. 16 shows an outline of a layout of a cell array section of a magnetic random access memory according to an eighth embodiment of the present invention. FIG. 17 is a section view taken along the line XVII—XVII of FIG. 16.

The magnetic random access memory according to the present embodiment is a modified example of the first and sixth embodiments.

In the present embodiment, the number of MTJ elements arranged in at least one portion of a plurality of portions is set to be larger than the number of MTJ elements arranged in each portion lower than the portion. In other words, the number of MTJ elements arranged in the fourth portion is larger than the numbers of MTJ elements arranged in the first, second, and third portions. In the present embodiment, the numbers of MTJ elements arranged in the first, second and third portions are equal.

Also in the eighth embodiment, the same effect as the first embodiment can be obtained.

(9) Ninth Embodiment

Figure 18:
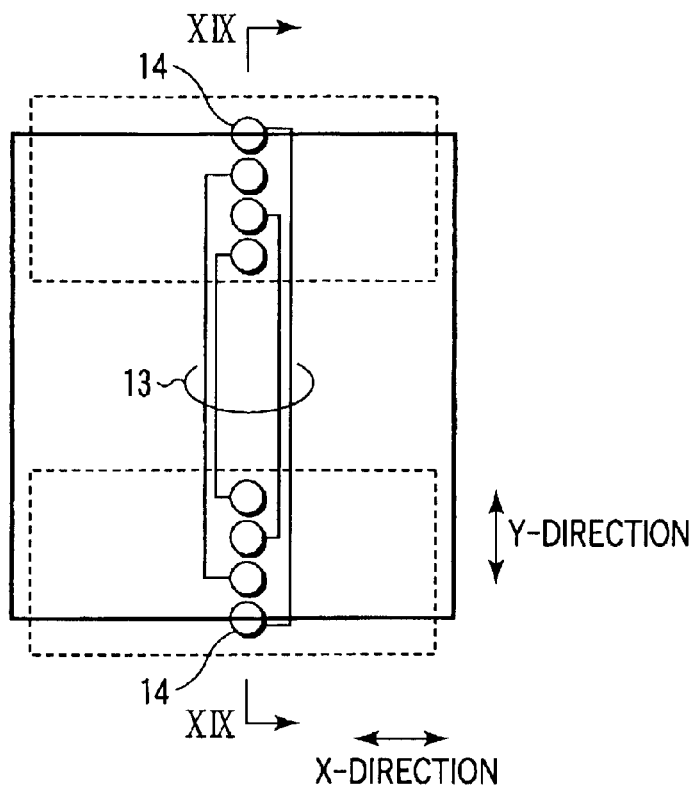
FIG. 18 is a plan view showing a cell array section of a memory according to a ninth embodiment of the present invention.
Figure 19:
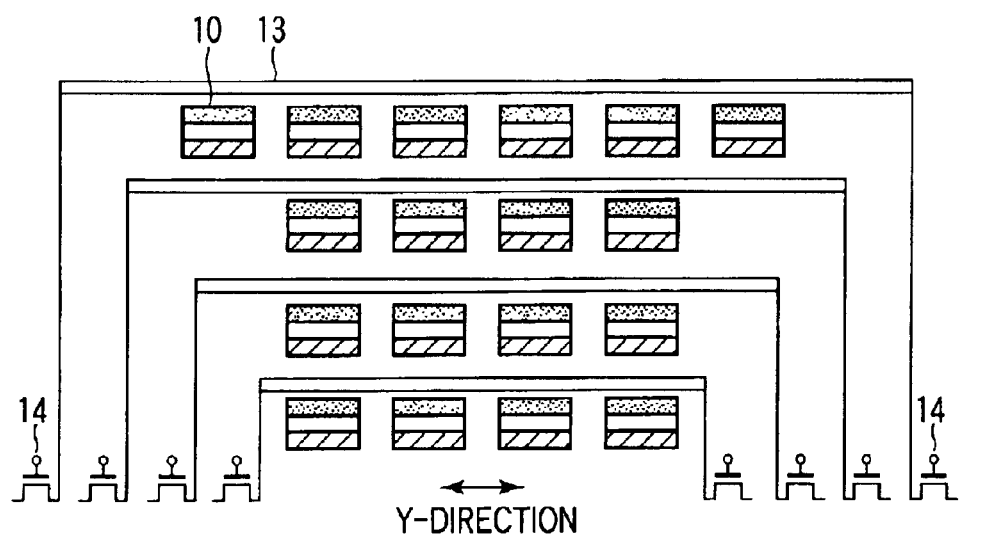
FIG. 19 is a section view taken along the line XIX—XIX of FIG. 18.

FIG. 18 shows an outline of a layout of a cell array section of a magnetic random access memory according to a ninth embodiment of the present invention. FIG. 19 is a section view taken along the line XIX—XIX of FIG. 18.

The magnetic random access memory according to the present embodiment is a modified example of the third and seventh embodiments.

In the present embodiment, the number of MTJ elements arranged in at least one portion of a plurality of portions is set to be larger than the number of MTJ elements arranged in each portion lower than the portion. In other words, the number of MTJ elements arranged in the fourth portion is larger than the numbers of MTJ elements arranged in the first, second, and third portions. In the present embodiment, the numbers of MTJ elements arranged in the first, second, and third portions are equal.

Also in the ninth embodiment, the same effect as the third embodiment can be obtained.

(10) Tenth Embodiment

Figure 20:
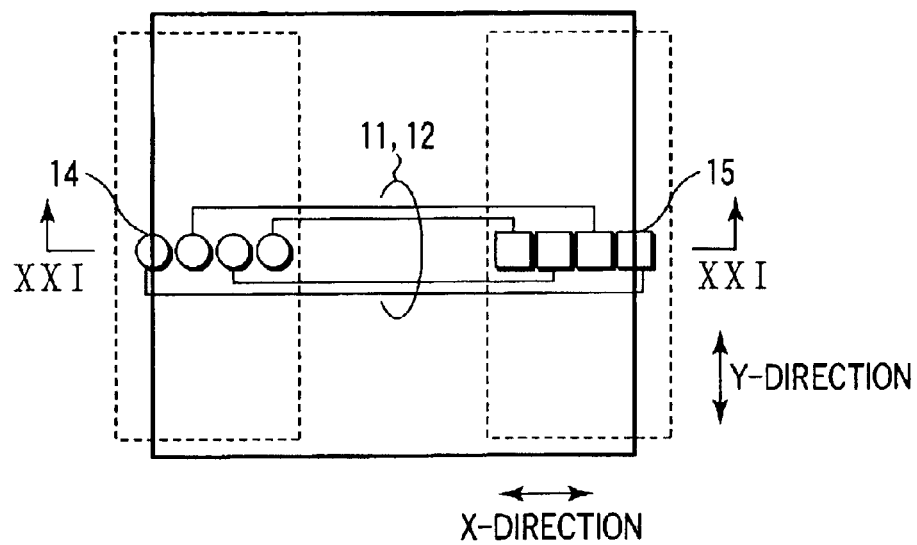
FIG. 20 is a plan view showing a cell array section of a memory according to a tenth embodiment of the present invention.
Figure 21:
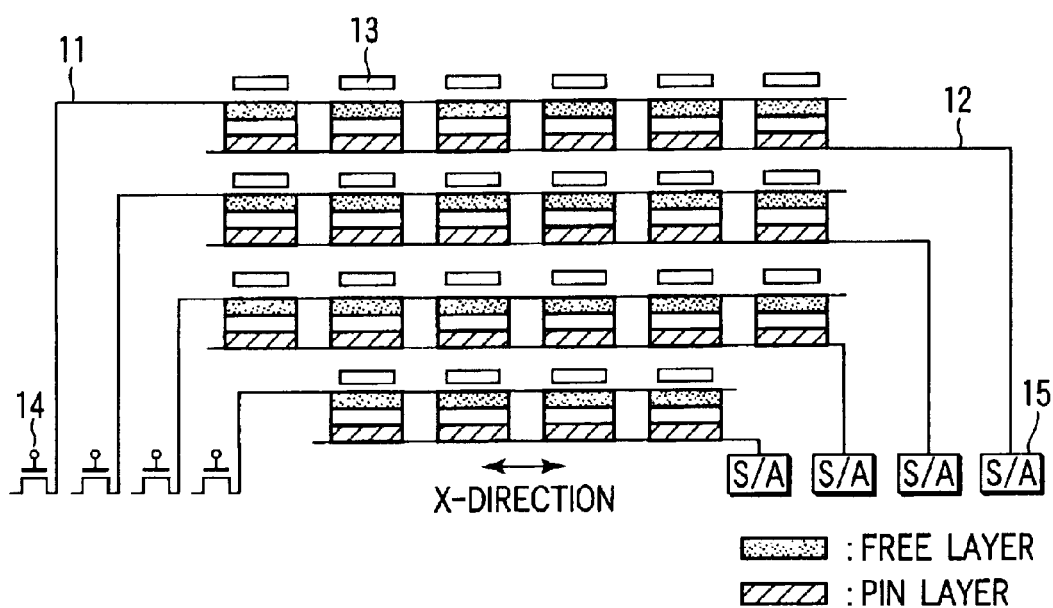
FIG. 21 is a section view taken along the line XXI—XXI of FIG. 20.

FIG. 20 shows an outline of a layout of a cell array section of a magnetic random access memory according to a tenth embodiment of the present invention. FIG. 21 is a section view taken along the line XXI—XXI of FIG. 20.

The magnetic random access memory according to the present embodiment is a modified example of the first and sixth embodiments.

In the present embodiment, the number of MTJ elements arranged in at least one portion of a plurality of portions is set to be larger than the number of MTJ elements arranged in each portion lower than the portion. In other words, the numbers of MTJ elements arranged in the second, third, and fourth portions are larger than the number of MTJ elements arranged in the first portion. In the present embodiment, the numbers of MTJ elements arranged in the second, third and fourth portions are equal.

Also in the tenth embodiment, the same effect as the first embodiment can be obtained.

(11) Eleventh Embodiment

Figure 22:
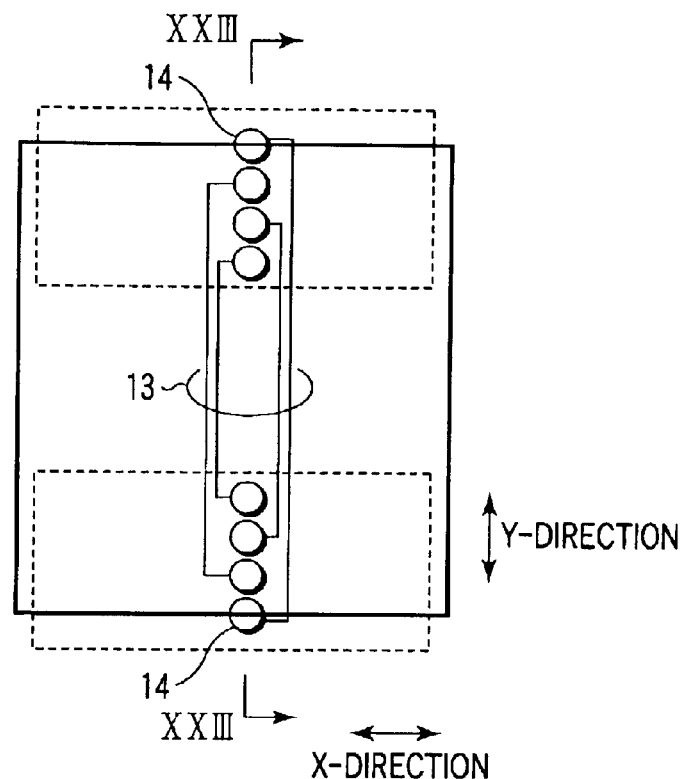
FIG. 22 is a plan view showing a cell array section of a memory according to a eleventh embodiment of the present invention.
Figure 23:
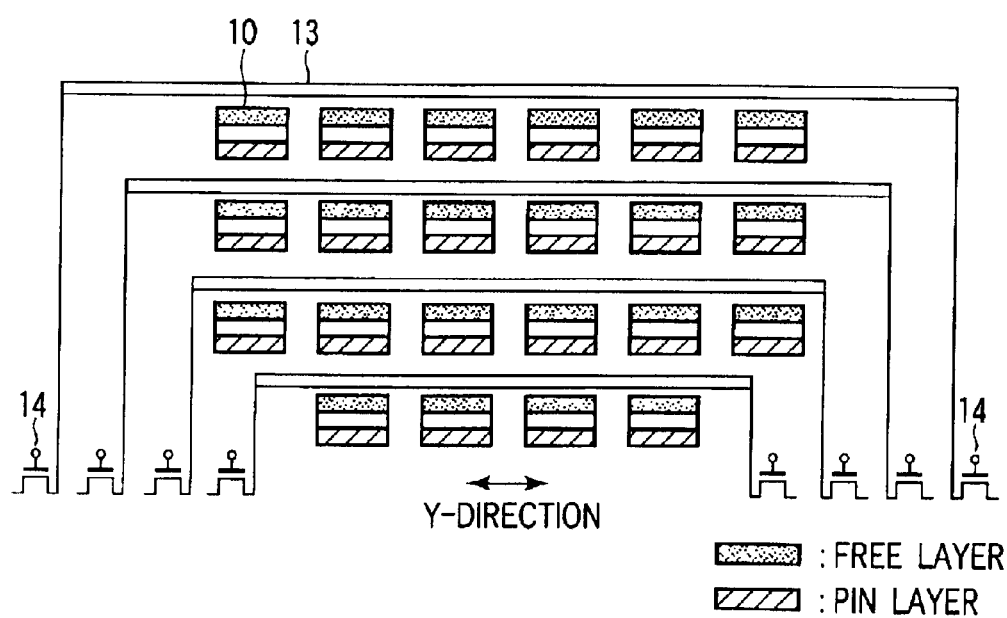
FIG. 23 is a section view taken along the line XXIII—XXIII of FIG. 22.

FIG. 22 shows an outline of a layout of a cell array section of a magnetic random access memory according to an eleventh embodiment of the present invention. FIG. 23 is a section view taken along the line XXIII—XXIII of FIG. 22.

The magnetic random access memory according to the present embodiment is a modified example of the third and seventh embodiments.

In the present embodiment, the number of MTJ elements arranged in at least one portion of a plurality of portions is set to be larger than the number of MTJ elements arranged in each portion lower than the portion. In other words, the numbers of MTJ elements arranged in the second, third, and fourth portions are larger than the number of MTJ elements arranged in the first portion. In the present embodiment, the numbers of MTJ elements arranged in the second, third, and fourth portions are equal.

Also in the eleventh embodiment, the same effect as the third embodiment can be obtained.

4. Others

The embodiments according to the present invention can be applied to any structures if the magnetic random access memory only has a cell array structure in which MTJ elements are accumulated in a plurality of portions.

In the first to fifth embodiments described above, the transistors connected to the conductive lines in the array of the MTJ elements are generally MOS transistors, but may be bipolar transistors, diodes, or the like.

Further, in the aforementioned first to fifth embodiments, the description is made by way of examples of the conductive lines arranged in each portion of the MTJ elements accumulated in a plurality of portions. However, the conductive lines having the same function are not arranged in each portion, and are arranged in every other portion in the case where the conductive lines are shared with the upper and lower lines, for example. Also in such a case, the embodiments according to the present invention can be applied to the conductive lines arranged every other portion.

As described above, according to the magnetic random access memory according to the embodiments of the present invention, even when the number of accumulated portions of the MTJ elements is increased so that the number of transistors connected to the conductive lines arranged in the array of the MTJ elements is increased in the array structure in which the MTJ elements are accumulated in a plurality of portions, the size or pitch of the MTJ elements can be determined irrespective of the number of transistors, thereby achieving fining or high integration of the MTJ elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   an array having a plurality of MTJ elements accumulated in a plurality of portions;
   first conductive lines arranged in the array;
   first elements connected to the first conductive lines;
   second conductive lines arranged in the array which have the same function as that of the fist conductive lines and are arranged above the first conductive lines; and
   second elements connected to the second conductive lines,
   wherein the number of MTJ elements arranged in at least one portion of said plurality of portions is larger than the number of MTJ elements arranged in each portion lower than the portion, and the first and second elements are arranged immediately below or on the periphery of the array.

2. A magnetic random access memory according to claim 1, wherein the first and second conductive lines extend in the same direction.

3. A magnetic random access memory according to claim 2, wherein the first and second elements are arranged in a line in the direction in which the first and second conductive lines extend.

4. A magnetic random access memory according to claim 1, wherein the first elements are arranged nearer to the center of the array than the second elements.

5. A magnetic random access memory according to claim 1, wherein, with respect to MTJ elements present in the direction in which the first and second conductive lines extend, the number of MTJ elements is gradually increased from a lower portion towards an upper portion.

6. A magnetic random access memory according to claim 2, wherein the first and second conductive lines extend in a row direction or in a column direction.

7. A magnetic random access memory according to claim 1, wherein the first and second conductive lines are conductive lines to be used for write operation or read operation.

8. A magnetic random access memory according to claim 1, wherein the first and second elements are switching elements.

9. A magnetic random access memory according to claim 1, wherein the first and second elements construct sense amplifiers.

10. A magnetic random access memory according to claim 1, wherein the first conductive lines are shorter than the second conductive lines.

11. A magnetic random access memory according to claim 1, wherein the number of MTJ elements is gradually increased from a lower portion towards an upper portion.

12. A magnetic random access memory according to claim 1, wherein the number of MTJ elements is gradually increased from a lower portion towards an upper portion every several portions.

13. A magnetic random access memory comprising:
an array having a plurality of MTJ elements accumulated in a plurality of portions;
first conductive lines arranged in the array;
fist elements connected to the conductive lines;
second conductive lines arranged in the array which have the same function as that of the first conductive lines, and are formed above the first conductive lines;
second elements connected to the second conductive lines,
wherein the first and second elements are both arranged on the periphery of the array but immediately below the array, and the first elements are arranged nearer to the array than the second elements.

14. A magnetic random access memory according to claim 13, wherein the first and second conductive lines extend in the same direction.

15. A magnetic random access memory according to claim 14, wherein the first and second elements are arranged in a line in the direction in which the first and second conductive lines extend.

16. A magnetic random access memory according to claim 13, wherein the first elements are arranged nearer to the center of the array than the second elements.

17. A magnetic random access memory according to claim 13, wherein, with respect to MTJ elements present in the direction in which the first and second conductive lines extend, the number of MTJ elements is gradually increased from a lower portion towards an upper portion.

18. A magnetic random access memory according to claim 14, wherein the first and second conductive lines extend in a row direction or in a column direction.

19. A magnetic random access memory according to claim 13, wherein the first and second conductive lines are conductive lines to be used for write operation or read operation.

20. A magnetic random access memory according to claim 13, wherein the first and second elements are switching elements.

21. A magnetic random access memory according to claim 13, wherein the first and second elements construct sense amplifiers.

22. A magnetic random access memory according to claim 13, wherein the first conductive lines are shorter than the second conductive lines.

23. A magnetic random access memory having a plurality of units, each unit comprising:
a plurality of MTJ elements arranged in a line;
first and second conductive lines which are commonly connected to the plurality of MTJ elements and sandwich the plurality of MTJ elements;
switching elements connected to one end of the first conductive lines; and
sense amplifiers connected to one end of the second conductive lines,
wherein the units are accumulated in a plurality of portions, and the number of MTJ elements arranged in at least one portion of said plurality of portions is larger than the number of MTJ elements arranged in each portion lower than the portion.

24. A magnetic random access memory having a plurality of units, each unit comprising:
a plurality of MTJ elements arranged in a line;
first and second conductive lines which are commonly connected to the plurality of MTJ elements and sandwich the plurality of MTJ elements;
switching elements connected to one end of the first conductive lines; and
sense amplifiers connected to one end of the second conductive lines,
wherein the units are accumulated in a plurality of portions, and the lengths of the first and second conductive lines arranged in at least one portion of said plurality of portions is longer than the lengths of the first and second conductive lines arranged in each portion lower than the portion.

25. A magnetic random access memory having a plurality of units, each unit comprising:
a plurality of MTJ element arranged in a line;
conductive lines commonly connected to the plurality of MTJ elements;
switching elements connected to one end of the conductive lines; and
switching elements connected to the other end of the conductive lines,
wherein the units are accumulated in a plurality of portions, and the number of MTJ elements arranged in at least one portion of said plurality of portions is larger than the number of MTJ elements arranged in each portion lower than the portion.

* * * * *